(12) United States Patent
Schlosser et al.

(10) Patent No.: US 8,207,585 B2
(45) Date of Patent: Jun. 26, 2012

(54) METHOD FOR PRODUCING A MICROMECHANICAL COMPONENT AND MIRCOMECHANICAL COMPONENT

(75) Inventors: Roman Schlosser, Reutlingen (DE); Heribert Weber, Nuertingen (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 860 days.

(21) Appl. No.: 12/300,544

(22) PCT Filed: Apr. 3, 2007

(86) PCT No.: PCT/EP2007/053221
§ 371 (c)(1),
(2), (4) Date: Nov. 12, 2008

(87) PCT Pub. No.: WO2007/131836
PCT Pub. Date: Nov. 22, 2007

(65) Prior Publication Data
US 2009/0162619 A1    Jun. 25, 2009

(30) Foreign Application Priority Data
May 12, 2006   (DE) .................. 10 2006 022 378

(51) Int. Cl.
*H01L 29/84* (2006.01)
(52) U.S. Cl. ............................ 257/415; 257/E23.133
(58) Field of Classification Search ............ 257/415, 257/416, E23.132, E23.133, E21.438, E21.485, 257/E21.487, E21.489, E21.49; 438/38, 438/53
See application file for complete search history.

(56) References Cited

U.S. PATENT DOCUMENTS

| 2002/0093038 A1 | 7/2002 | Ikeda et al. | |
|---|---|---|---|
| 2003/0005774 A1* | 1/2003 | Suzuki et al. | 73/724 |

FOREIGN PATENT DOCUMENTS

| DE | 102 06 711 | 8/2003 |
|---|---|---|
| DE | 10 2004 01544 | 9/2005 |
| EP | 1 441 561 | 7/2004 |
| EP | 1 648 195 | 4/2006 |
| JP | 2000-22172 | 1/2000 |
| JP | 2005-191208 | 7/2005 |

OTHER PUBLICATIONS

Schmid P. et al.: "Plasma deposition of Si-N and Si-O passivation layers on three-dimensional sensor devices", Surface and Coatings Tecnology Elsevier Switzerland, vol. 98, No. 1-3, Jan. 1998, pp. 1510-1517, XP002444452, ISSN: 0257-8972, the whole document.

* cited by examiner

*Primary Examiner* — Victor A Mandala
*Assistant Examiner* — Selim Ahmed
(74) *Attorney, Agent, or Firm* — Kenyon & Kenyon LLP

(57) ABSTRACT

A method is provided for producing a micromechanical component and a micromechanical component is provided, particularly a microphone, a micro-loudspeaker or a pressure sensor (an absolute pressure sensor or a relative pressure sensor) having a substrate and having a diaphragm pattern, for the production of the diaphragm pattern, process steps being provided that are compatible only with a circuit that is monolithically integrated into or on the substrate, a sacrificial pattern applied onto the substrate being removed for the production of the diaphragm pattern.

11 Claims, 4 Drawing Sheets

METHOD FOR PRODUCING A MICROMECHANICAL COMPONENT AND MIRCOMECHANICAL COMPONENT

FIELD OF THE INVENTION

The present invention relates to a method for producing a micromechanical component and to a micromechanical component.

BACKGROUND INFORMATION

A method for producing an acoustical pattern on a substrate is discussed in European Patent Application EP 1 441 561 A2. A diaphragm is produced, in this instance, on top of a substrate material by etching a free space all the way through the diaphragm and between the diaphragm and the substrate, the diaphragm distance (clearance) being provided via an etching process having no end point or etching limit. It is a disadvantage, in this case, that the distance apart of the electrodes of the capacitor device, which is formed between the diaphragm and the substrate, is only poorly defined, so that, on the one hand, the diaphragm distance is able to be specified only very inaccurately, and, on the other hand, a comparatively large diaphragm distance has to be provided which has the result that the signal that is able to be derived from the capacitor device is comparatively small, or the sensitivity is low.

SUMMARY OF THE INVENTION

By contrast, the method according to the present invention for producing a micromechanical component, and the micromechanical component according to the alternative independent claims has the advantage that the diaphragm pattern, for one thing, is able to have a very thin diaphragm which, in addition, is able to be situated at a comparatively short distance from a subsection of the substrate, so that, with respect to the electrode separating distances of the capacitor device, particularly short distances are able to be implemented. Furthermore, according to the exemplary embodiments and/or exemplary methods of the present invention it is particularly advantageous that the distance of the diaphragm pattern from the substrate material or rather the substrate is able to be set particularly accurately, and is particularly exactly reproducible and preselectable, and plane-parallel electrode surfaces are able to be created. Moreover, it is advantageously possible that after each etching step, in which substrate material is removed, a passivating layer is deposited for the protection of exposed substrate walls. By substrate walls we understand, in this case, areas of the substrate running essentially perpendicular to the main plane of extension of the diaphragm pattern.

According to the exemplary embodiments and/or exemplary methods of the present invention, the sacrificial pattern may be applied in or on a first side of the substrate, the sacrificial pattern being removed, using an etching step, from a second side of the substrate opposite to the first side. It is thereby possible that the diaphragm pattern is developed essentially continuous, that is, having no holes or recesses, so that the component according to the present invention may be used both for measuring short-term pressure fluctuations, particularly sound waves, and also for measuring static pressure conditions, as is required of an absolute pressure sensor or a relative pressure sensor.

According to the exemplary embodiments and/or exemplary methods of the present invention that, timewise before and/or after the production of the layer forming the diaphragm pattern, process steps may be carried out for producing the monolithically integrated circuit. By doing this, it is advantageously possible, according to the exemplary embodiments and/or exemplary methods of the present invention, that an evaluation circuit or a control circuit for the micromechanical component may be provided directly on the substrate, monolithically integrated, so that the production of the component is made considerably simpler and more cost-effective.

According to the exemplary embodiments and/or exemplary methods of the present invention, overlayers applied in the area of the diaphragm pattern may be at least partially removed and that at least one recess is applied into the diaphragm pattern. By doing this, the mechanical stability of the diaphragm pattern as well as its permeability may be adapted to the respective requirements of the application.

A further subject matter of the exemplary embodiments and/or exemplary methods of the present invention is a micromechanical component, especially a microphone, a microloudspeaker or a pressure sensor, which is producible according to the method of the present invention, and having the diaphragm pattern and at least one subsection of the substrate as a capacitor device. Because of this, particularly short diaphragm distances from the subsection of the substrate may be implemented, which leads to an especially great sensitivity of the micromechanical component. According to the present invention, the distance of the diaphragm pattern from the subsection of the substrate may be less than about 10 µm, and may be less than 5 µm, and may especially be less than about 2 µm and quite especially may be less than about 1 µm. Because of that, it is possible, on the one hand, to adjust the diaphragm pattern to the respective field of application of the component, and on the other hand, to achieve a high sensitivity of the component.

According to the exemplary embodiments and/or exemplary methods of the present invention, the diaphragm pattern may have a first electrode and the subsection of the substrate has a second electrode, the first electrode and/or the second electrode being protected by at least one passivating layer. For this reason, the micromechanical component is able to be exposed to a medium in which pressure is measured, for example, or in which acoustical waves are to be detected or excited. Because of such a medium contact, in this context, the first and the second electrode are advantageously not attacked by a possibly aggressive medium.

According to the exemplary embodiments and/or exemplary methods of the present invention, the diaphragm pattern may be provided together with a circuit that is monolithically integrated in or on the substrate, and that the diaphragm pattern is provided to be continuous, or that the diaphragm pattern has recesses. This enables micromechanical components in a particularly simple manner to be adapted to a large number of application cases, for instance, for an absolute pressure sensor or a relative pressure sensor having a diaphragm pattern that is provided to be continuous (without recesses or holes), or for acoustical applications in which a pressure equalization between the two sides of the diaphragm pattern is advantageous, and therefore the diaphragm pattern has recesses or holes. Furthermore, the monolithically integratable circuit may be provided together with the micromechanical component either monolithically integrated or separately, so that, for example, a plurality of components according to the present invention may be connected to a separate circuit.

It may also be that the subsections and the electrodes may be surrounded on all sides by at least one passivating layer and that the walls of the recesses and the second side of the substrate are covered by at least one passivating layer. This aids one in achieving a particularly good long-term stability and media durability of the entire sensor system or the component.

Exemplary embodiments of the present invention are shown in the drawings and explained in greater detail in the following description.

DETAILED DESCRIPTION

Figure 1:
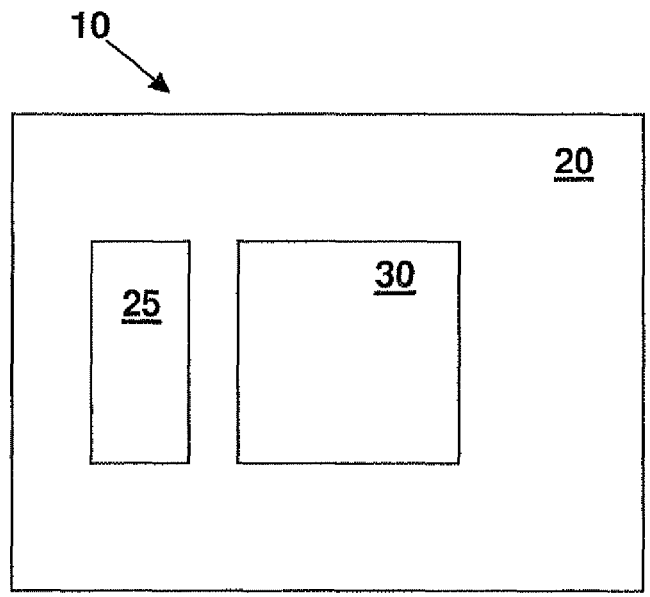
FIG. 1 shows a schematic representation of a component according to the present invention in a top view.

FIG. 1 shows a schematic representation of a micromechanical component 10 in a top view. Component 10 has a substrate 20 and a diaphragm pattern 30. It is particularly provided that, along with diaphragm pattern 30, a circuit 25 is provided that is monolithically integrated in or on substrate 20. Such a circuit 25 may be, for example, an evaluating circuit or a control circuit, or even a combined evaluating circuit and/or control circuit for diaphragm pattern 30 and for micromechanical component 10. Using diaphragm pattern 30, component 10 in particular implements a pressure sensor for relative pressures or for absolute pressures and/or a structure for detection or an actuator structure for acoustical waves. This makes it possible to use component 10, for example, as a microphone or a micro-loudspeaker.

Figure 2:
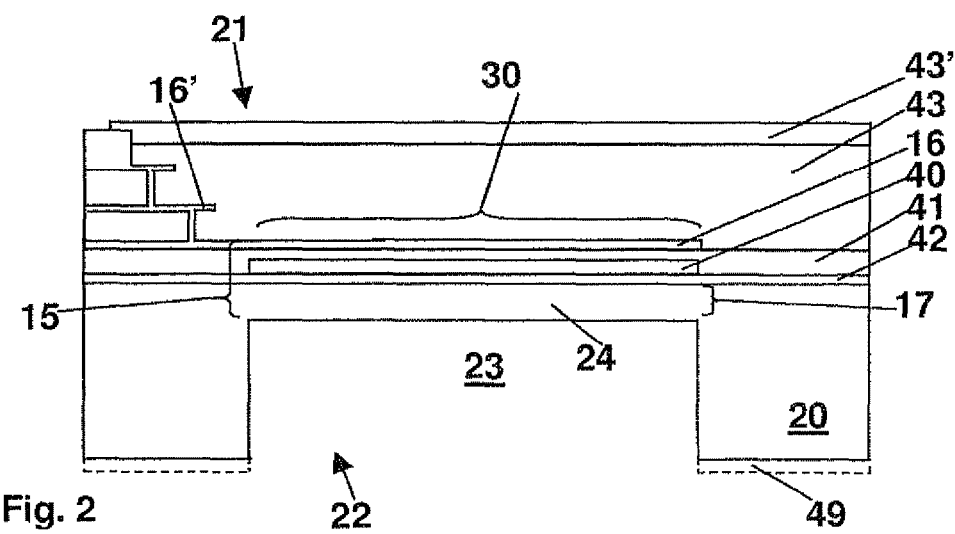
FIG. 2 shows a precursor structure of the component according to the present invention so as to show the method according to the present invention in a sectional representation.

FIGS. 2 though 10 show sectional representations through precursor structures of component 10 or through component 10. FIGS. 2 through 7 and 9 show precursor structures of component 10, which is shown in FIG. 8, and is shown in a variant in FIG. 10. The precursor structures are used in this instance to show the production method according to the present invention. FIG. 2 shows a first precursor structure in which, on a first side 21 of substrate 20, a dielectric layer was deposited, for instance, a silicon oxide layer, which will subsequently be designated as second passivating layer 42. After second passivating layer 42, a sacrificial layer or a sacrificial pattern 40 is applied and patterned. This sacrificial pattern 40 or this sacrificial layer 40 has essentially polycrystalline silicon, for instance, which was applied in a patterned manner on second passivating layer 42, for example, using a CVD method (chemical vapor deposition). A further dielectric layer 41 is applied on sacrificial pattern 40, which will also be denoted as first passivating layer 41 below. First passivating layer 41 forms a part of diaphragm pattern 30, at least in the area of sacrificial pattern 40. At least one electrically conductive layer is deposited as first electrode 16 above first passivating layer 41. On first electrode 16, additional overlayers may be applied, according to the present invention, which are required when producing electrical or electronic circuit 25 in another subsection of substrate 20.

These additional overlayers will be denoted in summarizing fashion below, using reference numeral 43, reference numeral 43' in particular denoting a closing passivating cover layer, made, for instance, of silicon nitride. The additional layers 43 have especially silicon oxide, but may also include a so-called multi-layer metallization 16', a multi-layer metallization 16' being used for a low-resistance connection of first electrode 16. From the direction of a second side 22 of substrate 20, second side 22 lying opposite first side 21, a cavity 23 may be inserted into substrate 20 in order, for example, to form a counterplate 24 to diaphragm pattern 30, which may be provided in a subsection 24 of the substrate, opposite diaphragm pattern 30. In order to produce a cavity 23, in particular, an etching mask 49 (shown as a dashed line) is produced on second side 22, and subsequently cavity 23 is produced using an etching method. Because of the electrically conductive material of substrate 20, a second electrode 17 is implemented by subsection 24 of substrate 20, so that, from first electrode 16 and second electrode 17 a capacitor device 15 comes about. In the precursor structure according to FIG. 2, diaphragm pattern 30 is not completely finished yet, because sacrificial pattern 40 is still present.

For the production of diaphragm pattern 30, further precursor structures of component 10 according to the present invention are shown in FIGS. 3 to 7.

Figure 9:
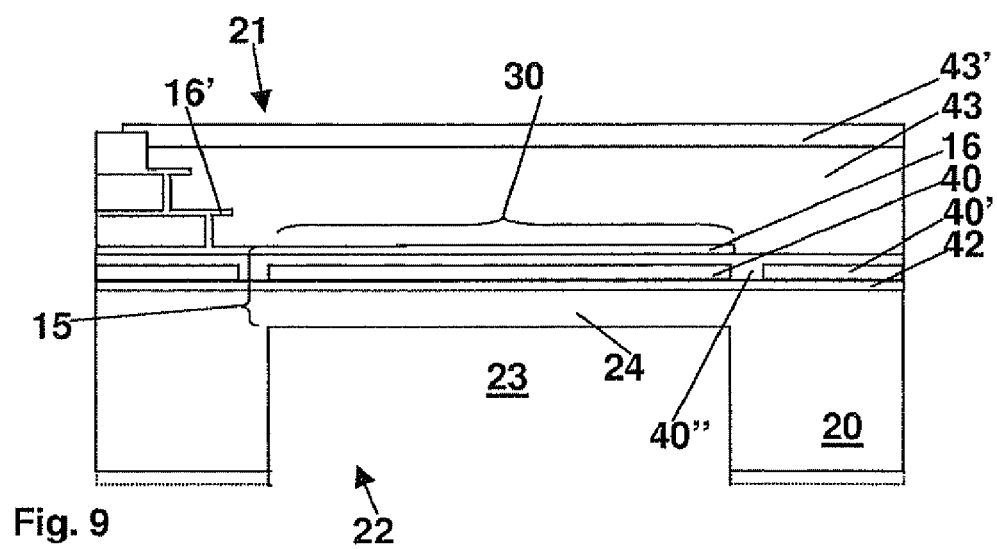
FIG. 9 shows a precursor structure of the component according to the present invention according to one embodiment variant.

FIG. 9 shows a representation, analogous to that in FIG. 2, for a further variant of component 10 according to the present invention. In this case, the layer of sacrificial pattern 40 is not only limited on the area of diaphragm pattern 30, but the material of the sacrificial pattern may also be found in an additional region of component 10. However, the material of sacrificial pattern 40 is shown applied patterned in such a way that, between sacrificial pattern 40 and the additional locations 40', a separating structure 40" is provided, so that sacrificial pattern 40 is defined in all its dimensions, that is, even in regard to its width, by the patterning of the material of sacrificial pattern 40. This also applies to the variant of component 10 shown in FIG. 2. Because of this, it is subsequently possible, according to the present invention, using an isotropic etching process, to remove completely sacrificial pattern 40, whereby a specified diaphragm pattern 30 may be implemented according to the present invention, that is, having comparatively accurately defined dimensions with regard to their distance from subsection 24 of substrate 20, and with regard to their width. The additional parts of FIG. 2 are also provided in FIG. 9, and are therefore not specifically addressed again.

Figure 3:
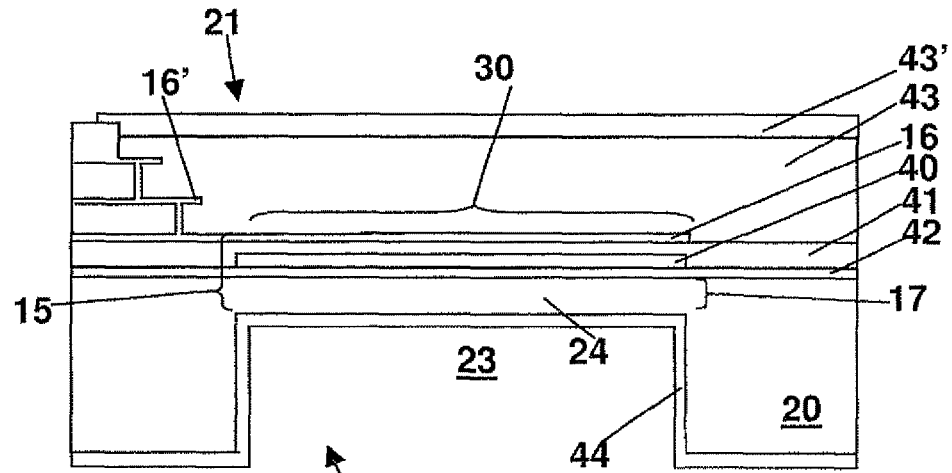
FIG. 3 shows a precursor structure of the component according to the present invention so as to show the method according to the present invention in a sectional representation.

FIG. 3 shows a second precursor structure of component 10 according to the present invention. By contrast to the first precursor structure (cf. FIG. 2 and FIG. 9), a third passivating layer 44 is applied on second side 22 of the substrate, particularly a silicon oxide layer, or generally an oxide layer. This third passivating layer is applied particularly to the walls of cavity 23, which are shown running essentially perpendicular in FIG. 3. Because of the third passivating layer 44, one is able to protect the cavity walls from an etching attack. Moreover, third passivating layer 44 is used as media protection for subsection 24 of substrate 20 which, in the case of an acoustical application of component 10, is drawn upon as a counterelectrode or as a counterelement for acoustically sensitive or acoustically actuated diaphragm pattern 30.

Figure 4:
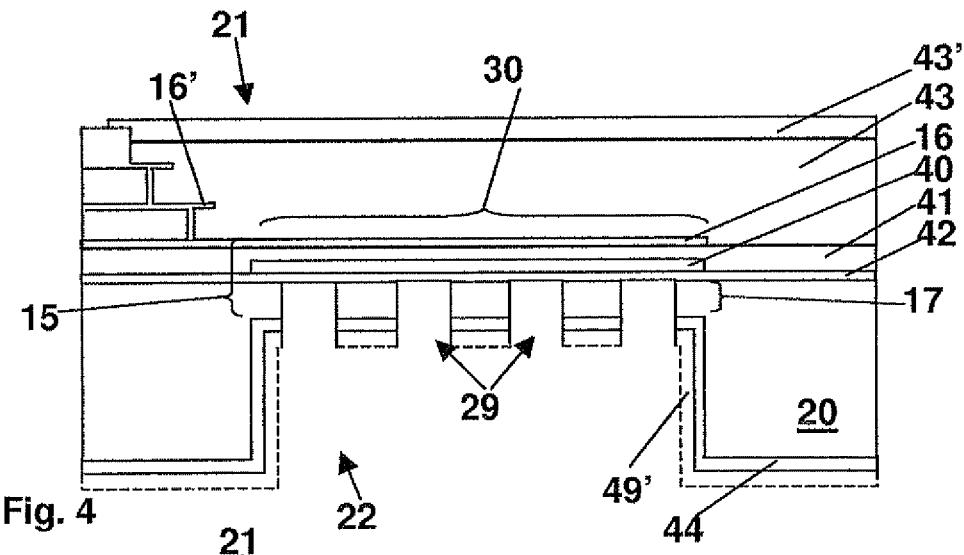
FIG. 4 shows a precursor structure of the component according to the present invention so as to show the method according to the present invention in a sectional representation.

FIG. 4 shows a third precursor structure of component 10 according to the present invention, the third precursor structure being shown after the execution of an etching process starting from second side 22 of substrate 20. For this purpose, on second side 22, an additional etching mask 49' is shown in dashed lines. At those places at which this further etching mask 49' has openings, openings 29 are inserted into substrate 20, all the way through third passivating layer 44 and through subsection 24 of substrate 20, up to passivating layer 42.

Figure 5:
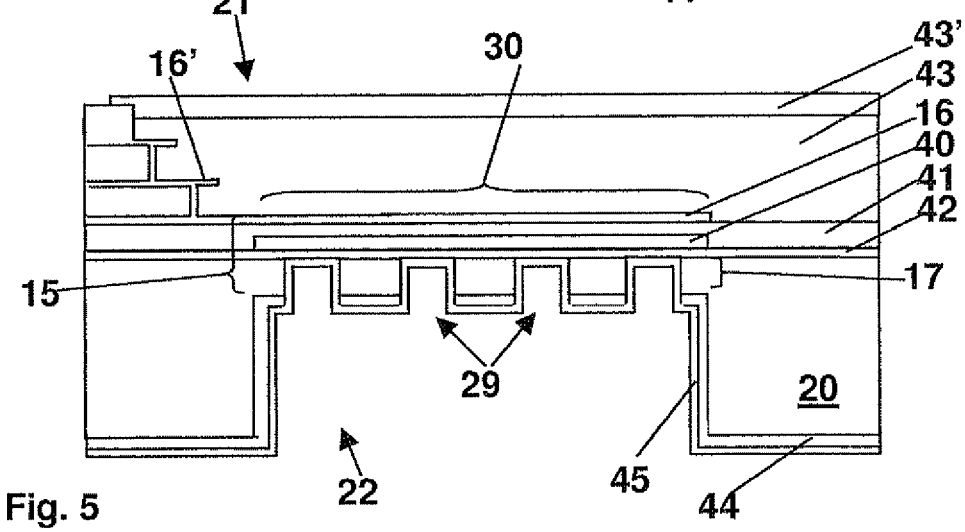
FIG. 5 shows a precursor structure of the component according to the present invention so as to show the method according to the present invention in a sectional representation.

FIG. 5 shows a fourth precursor structure of component 10 according to the present invention, on second side 22 of substrate 20 a fourth passivating layer 45 having been applied. This particularly passivates the perpendicularly running walls of openings 29, so that the resulting system is more resistant to a media contact.

Figure 6:
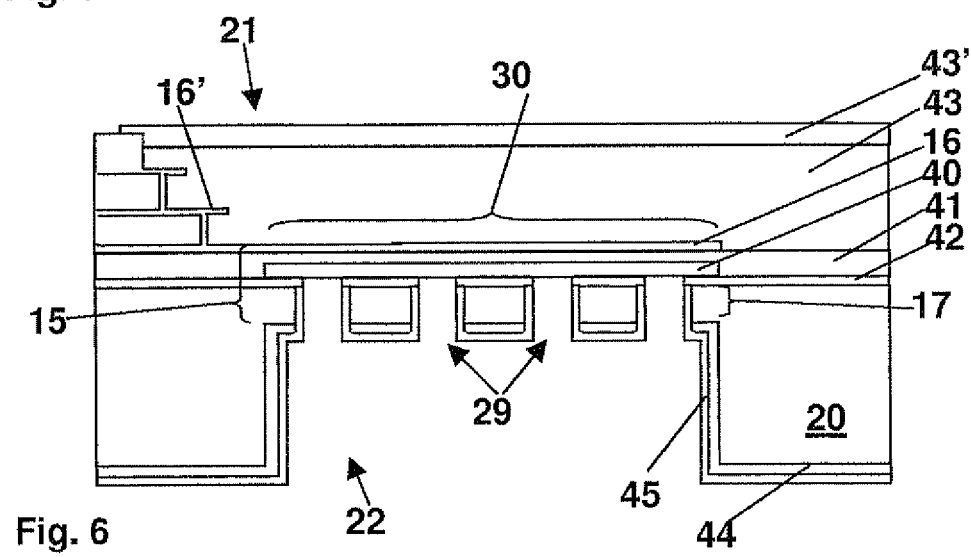
FIG. 6 shows a precursor structure of the component according to the present invention so as to show the method according to the present invention in a sectional representation.

FIG. 6 shows a fifth precursor structure of the component, in the case of the fifth precursor structure, starting from second side 22 of substrate 20, an additional etching step having been carried out to remove second passivating layer 42 and fourth passivating layer 45. An anisotropic etching step, for example, a plasma etching step or an ion beam etching step is used for this, in particular, which is suitable for removing the exposed second and fourth passivating layers 42, 45.

Figure 7:
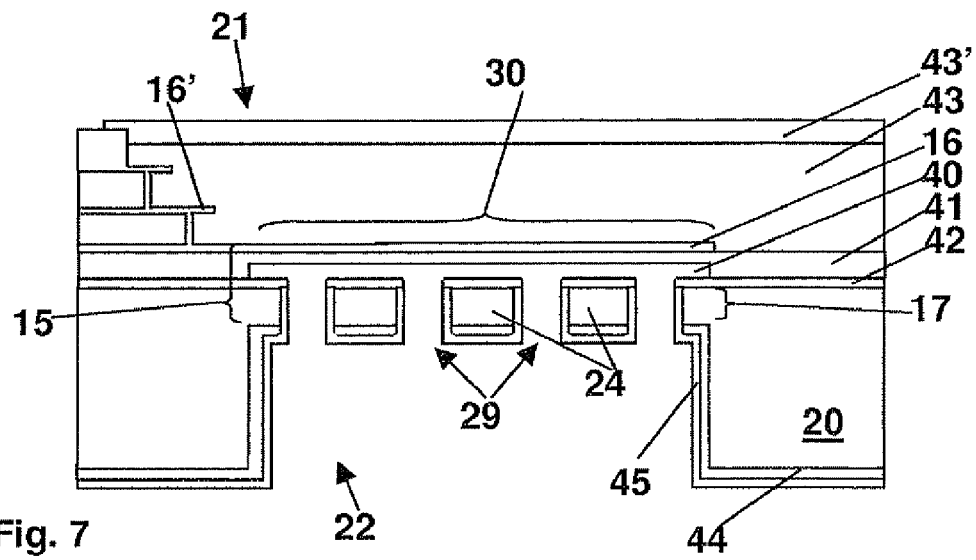
FIG. 7 shows a precursor structure of the component according to the present invention so as to show the method according to the present invention in a sectional representation.
Figure 8:
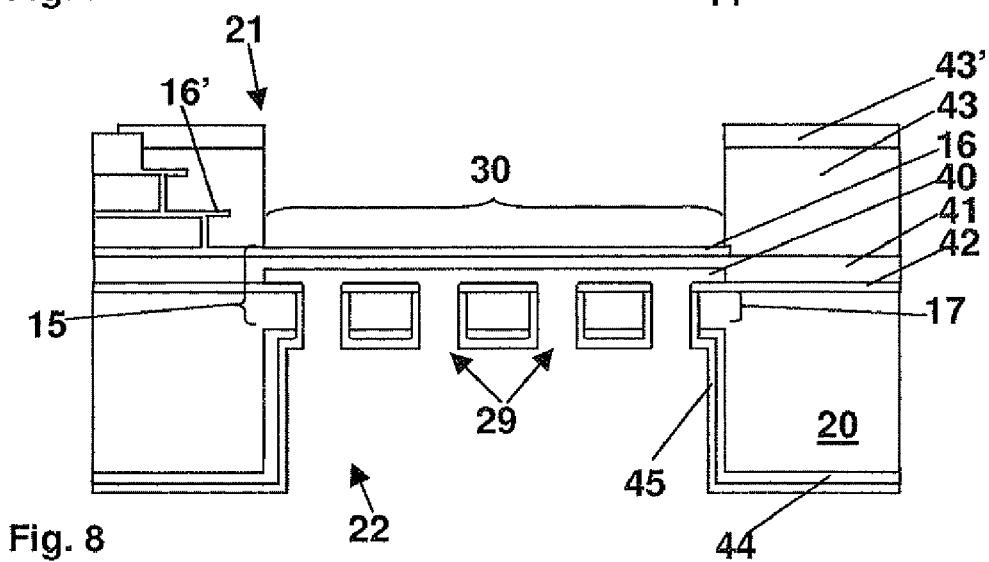
FIG. 8 shows a component according to the present invention in a sectional representation.

FIG. 7 shows a sixth precursor structure of component 10, in which sacrificial pattern 40 has been removed, especially using a gas phase etching process, particularly using $ClF_3$. It may be seen that second passivating layer 42, third passivating layer 44 and fourth passivating layer 45 completely cover and therefore passivate subsection 24 of substrate 20 and of the counterelement in spite of openings 29 in this subsection 24.

FIG. 8 shows component 10 according to the present invention, in which, compared to FIG. 7, the overlayers still remaining in diaphragm area 30, above electrode 16, have been removed. Alternatively to complete removal of these cover layers, it may, of course, also be provided that a part of overlayers 43 are left standing in this area. It is particularly provided according to the present invention that first electrode 16 is provided in passivated form also with respect to its upper side, using a resist layer (not shown).

Component 10 according to the present invention, as shown in FIG. 1, may, for instance, have a square or cornered shape of diaphragm pattern 30 (in a top view) or a round, oval or other shape of diaphragm pattern 30. Moreover, openings 29 may be provided as round, cornered, square, rectangular or oval openings 29 (in a top view).

A semiconductor substrate is particularly involved when it comes to substrate 20, which may be a silicon substrate, such a silicon substrate may be able to be provided doped continuously or at least from part to part. It may be advantageously provided according to the exemplary embodiments and/or exemplary methods of the present invention, especially in subsection 24 of substrate 20, which is situated opposite diaphragm pattern 30, that doping is provided for producing a comparatively low-resistance connection between subsection 24 and a connecting contact surface (that is not shown) for electrical contacting. In the figures it is not shown that diaphragm pattern 30, on its part, may have openings in order, particularly for acoustical applications, to permit pressure equalization on both sides of diaphragm pattern 30.

It is provided, according to the exemplary embodiments and/or exemplary methods of the present invention, that the gap between diaphragm pattern 30 and subsection 24 of substrate 20 is particularly small and is particularly exactly reproducible. Because of this, it is possible that a slight distance between electrodes 16, 17 of component 10, and going along with that, a high sensitivity, may be implemented. In particular, in this connection, electrode separation distances of electrodes 16, 17 of less than 2 µm are achievable. In the case of subsection 24, essentially a diaphragm is also involved which, however, is provided to be substantially thicker than diaphragm pattern 30. Because of this, subsection 24 is considerably more massive than diaphragm pattern 30, and is therefore able to be used for acoustical applications as a counterelement or back panel of diaphragm pattern 30.

The formation of a circuit, particularly of an evaluating circuit, in substrate 20 makes it possible to avoid a costly multiple-chip design approach.

Figure 10:
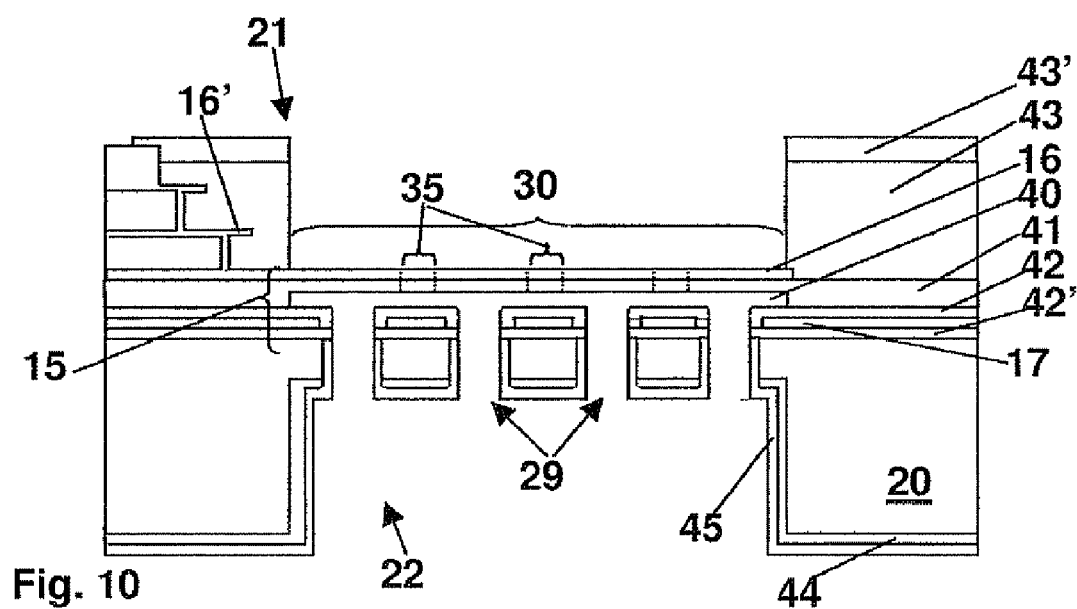
FIG. 10 shows a component according to the present invention according to one variant of the present invention in a sectional representation.

According to one variant of the exemplary embodiments and/or exemplary methods of the present invention, as shown schematically in a sectional representation in FIG. 10, second electrode 17 may also be implemented in such a way that on the first side of substrate 20, first of all a fifth passivating layer 42' is deposited, and then a conductive layer to form electrode 17 (for example, a metal layer or even a doped, and thus conductive polysilicon layer), and after that, in turn, second passivating layer 42. The remaining production steps are as described above.

An additional variant of the exemplary embodiments and/or exemplary methods of the present invention, also shown in FIG. 10, to be sure, but independent of the design of second electrode 17, relates to inserting recesses 35, that are indicated only by dotted lines, into diaphragm pattern 30, for example, for acoustical applications.

What is claimed is:

1. A micromechanical component, comprising:
    a substrate and having a diaphragm pattern, and including:
    on a first side of the substrate, a sacrificial layer area on a second passivating layer and which is masked by a first passivating layer of a first electrode and by further overlayers;
    recesses, in the substrate, from a second side of the substrate that lies opposite the first side, that reach all the way to the second passivating layer by at least one etching operation;
    a fourth passivating layer for the protection of the exposed walls of the substrate;
    wherein, after a removal of the second and the fourth passivating layer in the regions of the recesses, the sacrificial layer area starting from the second side is removed,
    wherein process operations provided for the production of diaphragm pattern are compatible only with a circuit that is monolithically integrated into or on the substrate, and
    wherein the diaphragm pattern and at least a subsection of the substrate are provided as a capacitor system.

2. The component of claim 1, wherein a distance of the diaphragm pattern from the subsection of the substrate is less than about 10 µm.

3. The component of claim 1, wherein the diaphragm pattern has a first electrode and the subsection of the substrate has a second electrode, at least one of the first electrode and the second electrode is protected by at least one passivating layer.

4. The component of claim 1, wherein the diaphragm pattern is provided together with a circuit that is monolithically integrated into or on the substrate.

5. The component of claim 1, wherein the diaphragm pattern is continuous.

6. The component of claim 1, wherein the diaphragm pattern has recesses.

7. The component of claim 1, wherein the subsections and the electrodes are enclosed on all sides by at least one passivating layer.

8. The component of claim 1, wherein the walls of the recesses and the second side of the substrate are covered by at least one passivating layer.

9. The component of claim 1, wherein the component is one of a microphone, a micro-loudspeaker and a pressure sensor.

10. The component of claim 1, wherein a distance of the diaphragm pattern from the subsection of the substrate is less than about 5 μm.

11. The component of claim 1, wherein a distance of the diaphragm pattern from the subsection of the substrate is less than about 2 μm.

* * * * *